United States Patent [19]
Bitting et al.

[11] Patent Number: 5,955,381
[45] Date of Patent: Sep. 21, 1999

[54] INTEGRATED CIRCUIT FABRICATION

[75] Inventors: Donald Stephen Bitting; Thomas Craig Esry, both of Orlando; David Huibregtse, Clairmont; Paul Edward Wheeler, Clermont, all of Fla.

[73] Assignee: Lucent Technologies Inc., Murray Hill, N.J.

[21] Appl. No.: 09/034,079

[22] Filed: Mar. 3, 1998

[51] Int. Cl.⁶ .................................................. H01L 21/00

[52] U.S. Cl. ........................................... 438/710; 438/729

[58] Field of Search ...................................... 438/710, 729

[56] References Cited

U.S. PATENT DOCUMENTS

| | | | |
|---|---|---|---|
| 4,754,009 | 6/1988 | Squire | 526/247 |
| 5,476,548 | 12/1995 | Lei et al. | 118/728 |
| 5,494,523 | 2/1996 | Steger et al. | 438/710 |
| 5,578,164 | 11/1996 | Kurono et al. | 438/729 |

*Primary Examiner*—Benjamin Utech
*Assistant Examiner*—Lynette T. Umez-Eronini
*Attorney, Agent, or Firm*—Anthony Grillo

[57] ABSTRACT

The quartz shadow ring of a conventional plasma etching apparatus is desirably coated with material which inhibits the liberation of oxygen into the plasma. Investigation has shown that the liberated oxygen degrades etching uniformity across the wafer.

5 Claims, 1 Drawing Sheet

INTEGRATED CIRCUIT FABRICATION

TECHNICAL FIELD OF THE INVENTION

The present invention relates to methods and apparatus for the clarification of integrated circuits.

BACKGROUND OF THE INVENTION

Many modern integrated circuit fabrication processes utilize plasma etching processes. Referring to FIG. 1, illustratively, in a plasma etching process, a wafer 19 is electrostatically supported by raised portion 15 of base 11. Base 11 is conventionally termed an "electrostatic chuck." Wafer 19 is surrounded by ring 13. Ring 13 is generally termed a "shadow ring". The purpose of the shadow ring is to protect base 11, 15 from the etching effect of the plasma, thereby insuring the chemical purity of the plasma. Typically, shadow ring 13 is made from quartz. Protrusion 21 comprises a silicon insert 23 which rests upon the quartz material of shadow ring 13. FIG. 1 does not show (for clarity) a shower head which is generally positioned above the wafer and the electrostatic chuck. The shower head provides the reactant gases which interact in a plasma to cause etching upon wafer 19.

Those concerned with the development of integrated circuit technology have consistently sought improved apparatus and methods for plasma processing.

SUMMARY OF THE INVENTION

An improved method of fabricating an integrated circuit includes:
- prior to placing a wafer in the vicinity of a plasma for the purpose of etching;
- surrounding the wafer with a shadow ring;
- the shadow ring having at least an upper surface which is incapable of liberating sufficient oxygen to significantly alter the plasma's etching properties.

Illustratively, polyimide has been found to be suitable for covering the upper surface of the shadow ring.

An alternative embodiment includes an apparatus for plasma processing of semiconductor wafers which has a shadow ring which has n upper surface which is incapable of liberating sufficient oxygen to significantly alter the plasma's etching properties.

DETAILED DESCRIPTION OF THE INVENTION

Applicant's investigations have indicated that the quartz material of shadow ring 13 liberates oxygen during the plasma etching process. This excess oxygen causes a degradation of the photoresist mask adherent to the upper surface of wafer 19 during etching. Degradation of the photoresist mask causes poor across-the-wafer etch uniformity. This poor across-the-wafer uniformity is particularly deleterious during the etching of critical-width lines, such as gates.

The aforedescribed problem has been observed to be particularly acute for linewidths of 0.25 microns and below which utilize deep UV lithography and hardmask etching techniques.

Figure 1:
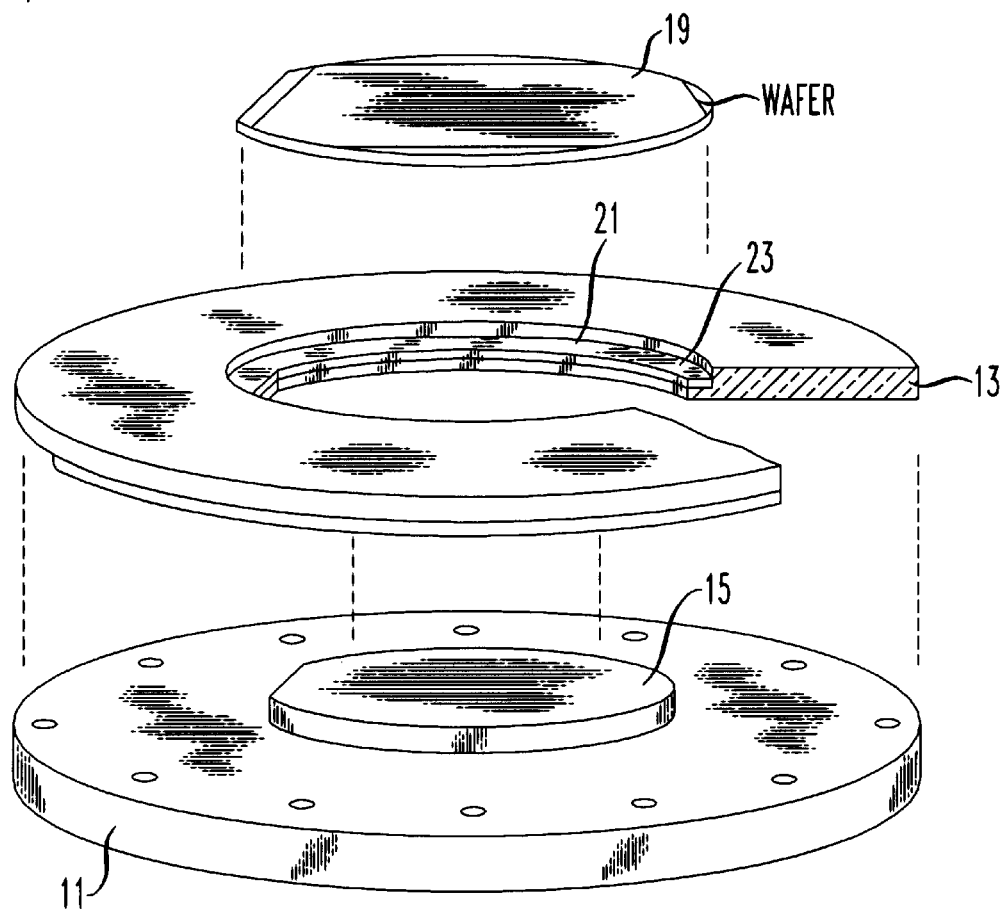
FIG. 1 is a partially perspective, partially cross-sectional view of a shadow ring together with wafer and supporting base or electrostatic chuck.
Figure 2:
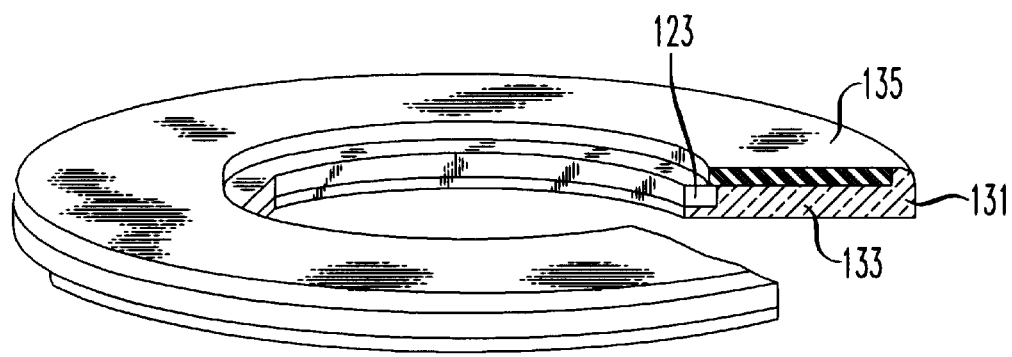
FIG. 2 is a partially perspective, partially cross-sectional view of an illustrative embodiment of the present invention.

In FIG. 2 there is shown an improved shadow ring 131. Structured stability is provided by quartz ring 133 having dimensions generally similar (except as noted below) to shadow ring 13. However, the upper surface of quartz ring 133 may be coated with a coating which will not liberate sufficient oxygen to adversely affect the etching process. Alternatively, reference numeral 135 denotes a separate ring-shaped piece of material which will not liberate sufficient oxygen to adversely affect the etching process. In general, the ring 135 may be a polyimide. An exemplary suitable polyimide is Vespel, a registered trademark of DuPont. It is not necessary that the ring 135 cover the entire surface of quartz ring 133. It is required, however, that a sufficient amount of the upper surface of quartz ring 133 be covered to prevent undesirable oxygen combination with the plasma. Insert 123 is made from silicon. Whereas, insert 123 has a width of 6.1" and a height of 0.14", improved insert 123 has a width of 6.9" and a height of 0.14". Larger insert 123 provides better high temperature matching between wafer 19 and ring 133.

Ring 135 need not be completely devoid of oxygen—is only required that its oxygen be adequately bound, or present in small enough quantities so that the plasma etching is not adversely effected.

Manufacture of the shadow ring 13 completely from, for example polyimide material, has been shown to be unsuitable because of thermal stability considerations.

The improved shadow ring design is particularly adaptable to conventional plasma etching processes, illustratively the Applied Materials 5000 equipment manufactured by Applied Materials Inc., Santa Clara, Calif. Applicability to other machines and designs is also envisioned.

What is claimed:

1. A method of manufacturing an integrated circuit comprising:
   providing a shadow ring having at least an upper surface which is incapable of liberating sufficient oxygen significantly to alter a plasma's etching properties, wherein said upper surface comprises a polyimide, said shadow ring having a support surface for supporting a wafer; and
   positioning said wafer on said support surface, said wafer surrounded by said shadow ring.

2. A method of fabricating an integrated circuit comprising:
   prior to placing a wafer in the vicinity of a plasma for the purpose of etching, surrounding said wafer with a shadow ring,
   said shadow ring having an upper surface comprising a polyimide.

3. A method of fabricating an integrated circuit comprising:
   providing a shadow ring formed from a first material and having an upper surface which is covered by a second material which is incapable of liberating sufficient oxygen to significantly alter a plasma's etching properties, said first material different from said second material; and
   prior to placing a wafer in the vicinity of said plasma for the purpose of etching, surrounding said wafer with said shadow ring, said second material positioned adjacent to said wafer.

4. A method of fabricating an integrated circuit comprising:
   prior to placing a wafer in the vicinity of a plasma for the purpose of etching, surrounding said wafer with a shadow ring;

said shadow ring having an upper surface which is covered by a polyimide ring.

5. The method of claim 1 wherein the shadow ring has a lower surface and further comprising:

providing said support surface between the upper surface and the lower surface.

* * * * *